United States Patent
Keigler et al.

(10) Patent No.: US 11,174,544 B2
(45) Date of Patent: Nov. 16, 2021

(54) BATCH PROCESSING SYSTEM WITH VACUUM ISOLATION

(71) Applicant: ASM NEXX, Inc., Billerica, MA (US)

(72) Inventors: Arthur Keigler, Billerica, MA (US); Kevin Barbera, Billerica, MA (US); Daniel L. Goodman, Billerica, MA (US)

(73) Assignee: ASM NEXX, INC., Billerica, MA (US)

( * ) Notice: Subject to any disclaimer, the term of this patent is extended or adjusted under 35 U.S.C. 154(b) by 92 days.

(21) Appl. No.: 16/568,575

(22) Filed: Sep. 12, 2019

(65) Prior Publication Data
US 2020/0087774 A1    Mar. 19, 2020

Related U.S. Application Data

(60) Provisional application No. 62/732,205, filed on Sep. 17, 2018.

(51) Int. Cl.
| | |
|---|---|
| H01J 37/32 | (2006.01) |
| C23C 14/02 | (2006.01) |
| H01L 21/677 | (2006.01) |
| C23C 14/56 | (2006.01) |
| C23C 14/34 | (2006.01) |
| H01L 21/67 | (2006.01) |

(52) U.S. Cl.
CPC .......... *C23C 14/021* (2013.01); *C23C 14/34* (2013.01); *C23C 14/568* (2013.01); *H01L 21/67207* (2013.01); *H01L 21/67739* (2013.01)

(58) Field of Classification Search
CPC .......... H01J 37/32798; H01J 37/32807; H01J 37/3288; H01J 37/32899; H01J 37/32733; H01L 21/67126; H01L 21/67161; H01L 21/6719; H01L 21/67207; H01L 21/67739; H01L 21/68764; H01L 21/68771; C23C 14/021; C23C 14/022; C23C 14/34; C23C 14/568
USPC .......... 204/298.25, 298.26, 298.27, 298.28, 204/298.23
See application file for complete search history.

(56) References Cited

U.S. PATENT DOCUMENTS

| | | | | |
|---|---|---|---|---|
| 3,652,444 A * | 3/1972 | Lester | .................. | B01J 3/006 204/298.25 |
| 5,183,547 A * | 2/1993 | Ikeda | .................. | C23C 14/56 204/298.25 |
| 5,688,389 A * | 11/1997 | Bjornard | .............. | C23C 14/042 118/500 |
| 6,183,615 B1 * | 2/2001 | Yasar | ................ | H01L 21/67709 204/192.12 |
| 6,235,171 B1 * | 5/2001 | Yamamoto | ............. | B82Y 25/00 118/719 |

(Continued)

*Primary Examiner* — Rodney G McDonald
(74) *Attorney, Agent, or Firm* — Ostrolenk Faber LLP

(57) ABSTRACT

A vapor deposition system comprises a vacuum chamber and two or more process modules each configured for processing a semiconductor substrate. Each process module is removably connected to a respective port of the vacuum chamber such that each process module is in vacuum communication with the vacuum chamber when connected to the respective port. A port sealing mechanism is configured to create a vacuum seal at each port such that when a first port is sealed and a first process module is disconnected from the first port, a vacuum condition is maintained within the vacuum chamber while the first process module is open to atmospheric pressure.

12 Claims, 14 Drawing Sheets

(56) References Cited

U.S. PATENT DOCUMENTS

2008/0260499 A1  10/2008  Meulen .................. 414/217
2009/0084671 A1* 4/2009  Hanai ................. C23C 14/562
                                              204/192.12

* cited by examiner

BATCH PROCESSING SYSTEM WITH VACUUM ISOLATION

BACKGROUND OF THE INVENTION

This disclosure relates to semiconductor device fabrication methods and systems.

Sputtering by physical vapor deposition (PVD) is widely used in the semiconductor industry for depositing thin metal films on semiconductor wafers. These films are typically composed of Ti, Cu, Al, Au, Ta, etc. In preparation of thin film deposition, a sputter etch clean is typically executed. After cleaning a surface, one of several types of vapor deposition techniques can be used. After thin film deposition, additionally fabrication and/or packaging steps can be continued.

SUMMARY

A common practice for depositing thin metal films on semiconductor substrates is to use multiple single-wafer process chambers in which each chamber deposits only one material at a time. Dedicating separate single-wafer process chambers to individual processes, however, adds cost to such systems and also requires intermediate robotic wafer handling which limits system throughput.

Batch processing systems have the advantage that several wafers can be processed at one time in a single, large, vacuum chamber. Single-chamber batch processing systems are typically sized to hold approximately 3-6 wafers in each chamber. All wafers are then coated simultaneously using PVD techniques. One limitation of such batch processing systems is that the multiple process positions inside the common vacuum chamber cannot be vacuum isolated from each other. This means that maintenance of one process module, which contains a respective process position, requires venting of all process modules.

In general, venting of a process chamber requires requalification before resuming production, which reduces system availability. For some processing chambers, venting a chamber leads to additional maintenance. For example, shields from PVD chambers using TiW as a target material typically must be cleaned if the chamber is vented, to prevent particle generation.

Other batch processing systems can provide vacuum isolation of the individual process modules. Such individual vacuum isolation, however, requires costly pumping arrangements.

As identified herein, a desirable solution provides the throughput of a batch processing system with the advantages of individual vacuum isolation systems, but without complex and costly vacuum equipment for each individual chamber. Techniques herein provide a batch processing system that uses common vacuum chamber pumping for processing of multiple treatment chambers instead of each chamber having its own vacuum pumping system. Thus, a single vacuum pump or vacuum pump arrangement can be used for a batch processing system. Up-to-air maintenance can be performed on some process modules while maintaining other process modules under vacuum. Moreover, vapor deposition processes can continue on semiconductor substrates under vacuum within the system while one or more process modules is detached for maintenance.

One embodiment includes a vapor deposition system with several components. A first vacuum chamber is configured to maintain a gaseous pressure less than atmospheric pressure. The first vacuum chamber is sized to permit transport of two or more semiconductor substrates within the first vacuum chamber. Two or more process modules are each configured for processing semiconductor substrates. Each process module is removably connected to a respective port of the first vacuum chamber such that each process module is in vacuum communication with the first vacuum chamber when connected to the respective port. Each process module is configured to maintain a gaseous pressure less than atmospheric when connected to the respective port. A port sealing mechanism is configured to create a vacuum seal at each port such that when a first port is sealed and a first process module corresponding to the first port is disconnected from the first port, a vacuum condition is maintained within the first vacuum chamber while the first process module is open to atmospheric pressure.

Another embodiment includes a vapor deposition system with several components. These components include a primary vacuum chamber with multiple process modules and a valve plate that is moveable within the primary vacuum chamber. Other components include a carrier for moving the valve plate from a standby position which allows processing of wafers in the process module, to a sealed position which isolates the process module from the primary vacuum chamber. The deposition system also includes a locking ring for compressing a valve plate o-ring to a sealing surface on the process module, providing sufficient o-ring compression to maintain atmosphere above the valve plate and high vacuum below the valve plate.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

The invention will be better understood with reference to the detailed description when considered in conjunction with the accompanying drawings, in which.

DETAILED DESCRIPTION

Figure 1:
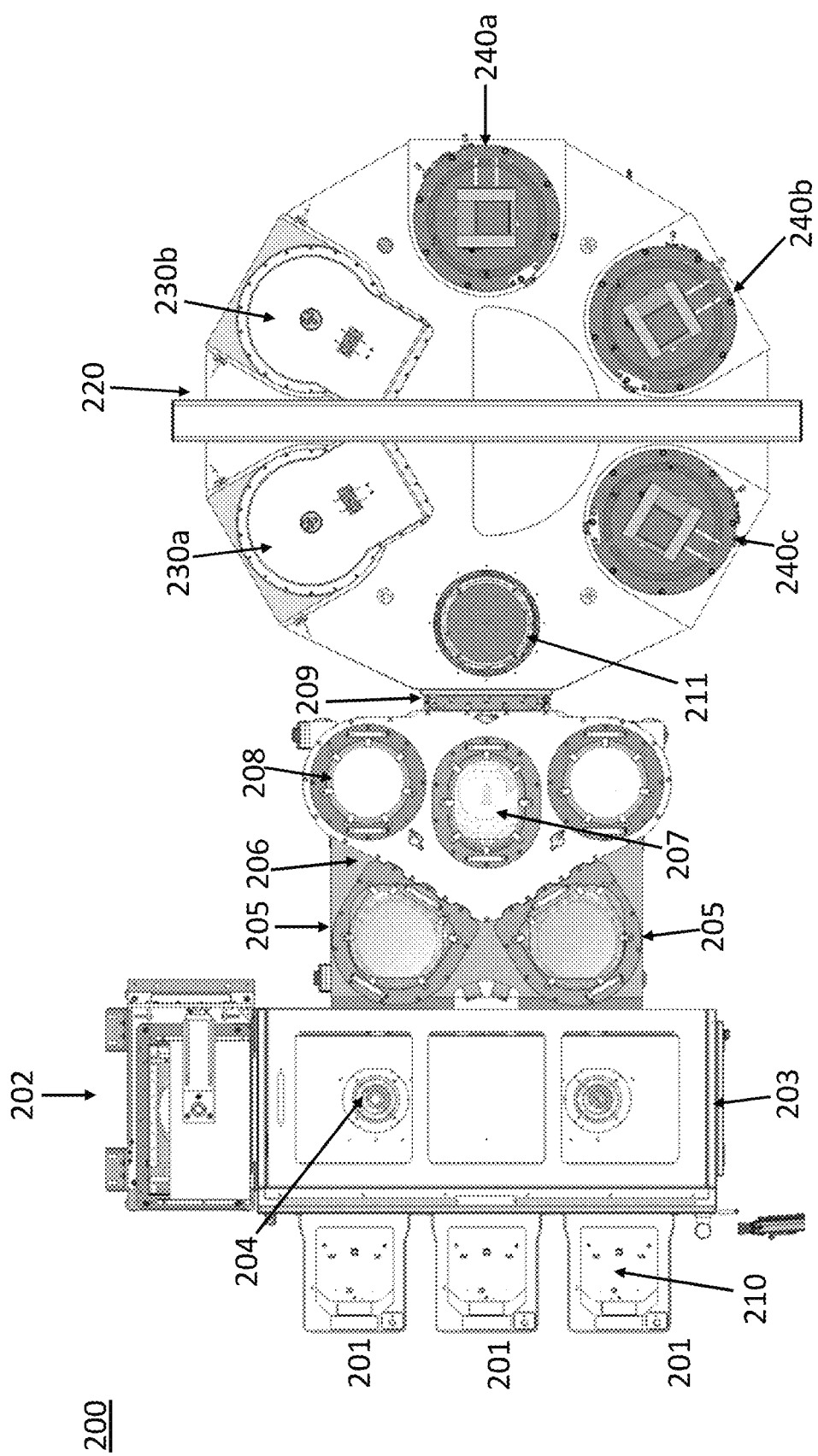
FIG. 1 schematically shows a PVD system from above.

An example vapor deposition system will now be described in more detail. FIG. 1 shows a PVD system 200 incorporating a batch processing chamber 220 with a transfer position and five process modules. System 200 is configured to simultaneously process five substrates by moving all wafers simultaneously from one position to a next position. Note that other systems can have more or fewer positions. The five process positions are centered within the two etch process modules 230a and 230b, and within three deposition process modules 240a, 240b and 240c. It should be noted that parts 201, 202, 203, 204, 205, 206, 207 and 208 shown in FIG. 1 are known in various forms in the art, as will be apparent to those skilled in the art, while parts 209, 211, 220, 230 and 240 shown in FIG. 1 are associated with the present invention. Furthermore, while it will be apparent from the following description that various parts of the present apparatus are movable and driven in operation, the means for effecting such driving are omitted for clarity. For the avoidance of doubt, actuation of these parts may be effected in a variety of ways, for example by connection of suitable electrically-operated motors or actuators, which are controlled by an operator or, more usually, by a control means (not shown), such as a suitably programmed computer or processor.

During operation, a substrate 210 inside Front Opening Unified Pod (FOUP) 201 is transported by a robot 204 in Front End 203 to batch de-gas module 202, as is generally known in the art. The substrate 210 can be composed of a semiconductor material or can be a composite wafer, such as used for Fan-out wafer-level packaging. Substrates can be circular or rectangular. After de-gas processing, robot 204 transports the substrate 210 to load-lock 205 for pump-down. After pump-down, as is generally known in the art, vacuum robot 207 transfers the substrate 210 to cooling chuck 208 in vacuum transfer module 206. Once cooled, robot 207 moves the substrate 210 through gate valve 209, and places the substrate onto carrier 211. Carrier disk 225 (see, for example, FIG. 2B) rotates clockwise, placing carrier 211 and the substrate into processing module 230a for sputter etch pre-clean. While substrate 210 is processed in process module 230a, an additional substrate 210 is placed onto the next carrier 211, which is attached to carrier disk 225.

Carrier disk 225, with substrates 210, on respective carriers 211, et cetera, continues to rotate through additional processing modules, sequentially executing each process. Process modules may include a second sputter etch pre-clean module 230b, a first PVD sputter deposition module 240a, a second PVD sputter deposition module 240b and a third PVD sputter deposition module 240c. The various deposition modules can be used to deposit a same metal or different metals. As can be appreciated, various deposition combinations can be used. Carrier 211 again rotates until the substrate is in transfer position at gate valve 209. Robot 207 transports substrate 210 to load-lock 205. After venting, robot 204 returns the processed substrate to FOUP 201.

Figure 2:
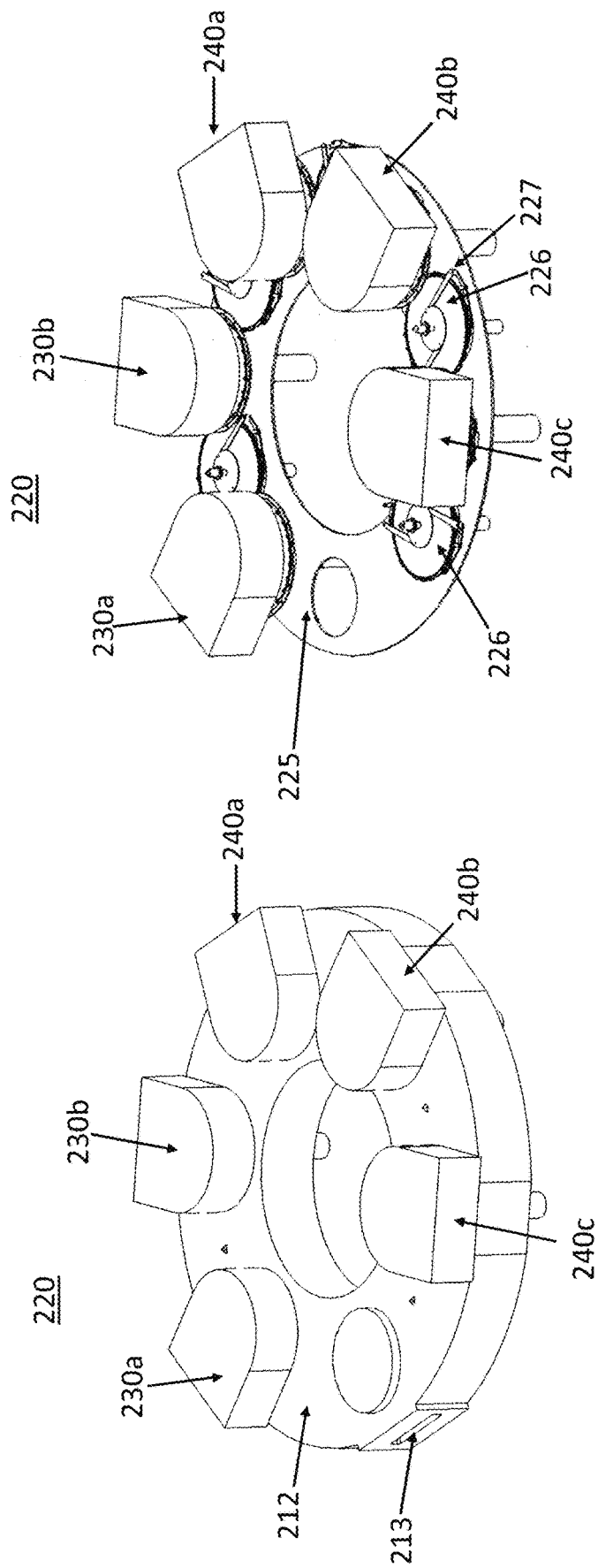
FIGS. 2A and 2B schematically show, in perspective view, a batch process chamber, with some parts transparent in 2B.

FIG. 2A illustrates details of the batch process chamber 220. These details include a primary vacuum chamber 212, and process-modules 230a, 230b, 240a, 240b, and 240c arrayed around the primary vacuum chamber 212. FIG. 2B shows the batch process chamber 220 with the primary vacuum chamber 212 hidden to show inner details. A transport disk or multi-module carrier 225 is rotatable within the primary vacuum chamber 212, with multiple positions to transport substrates 210. Valve plates 226 are shown in a standby position being held by a standby support linkage 227. Wafers or substrates 210 are inserted into this chamber 212 through slot 213 in a lateral face of vacuum chamber 212, in a position devoid of a process chamber. This motion is provided by means of a vacuum robot 207, and the primary vacuum chamber 212 is attached to vacuum transfer module 206 at this face.

Figure 3:
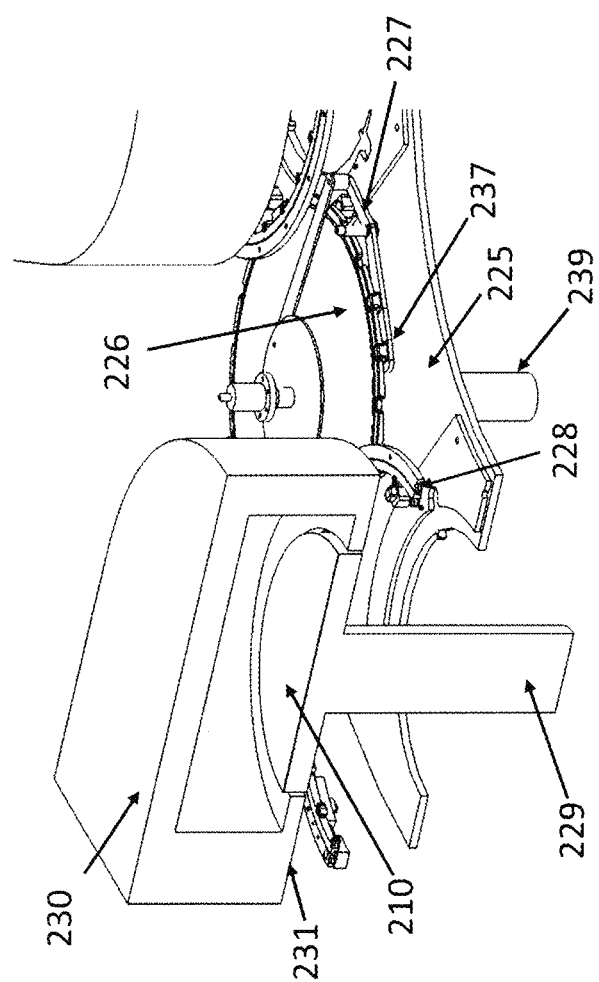
FIG. 3 schematically shows, in enlarged perspective view, a section of a processing module during an operation.

FIG. 3 shows a processing module 230 during an operation, in which process chuck 229 supports substrate 210 during processing. Multi-module carrier 225 is positioned rotationally such that the process chuck 229 can move vertically through an opening in multi-module carrier 225. Valve plate 226 is positioned in a plane vertically above lift pedestal 239 and multi-module carrier 225 using standby linkage 227. Alignment features 237 in linkage 227 ensure that valve plate 226 is centered relative to pedestal 239. A locking ring 228 is in a vertical plane between the valve plate 226 and a base 231 of process module 230.

Figure 4B:
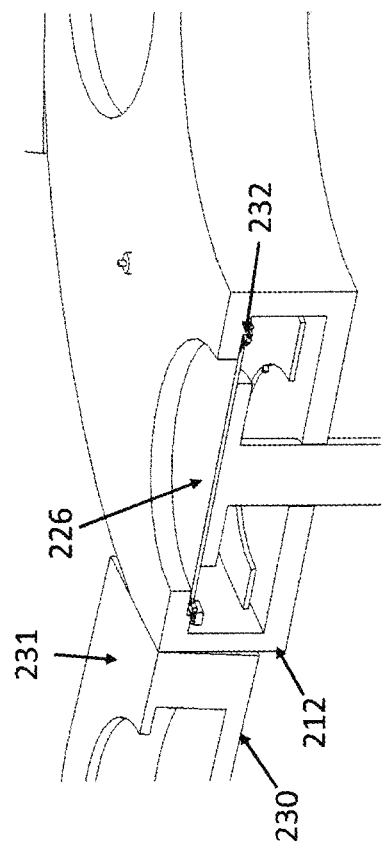
FIG. 4B is similar to FIG. 4A, but including the vacuum chamber.
Figure 4A:
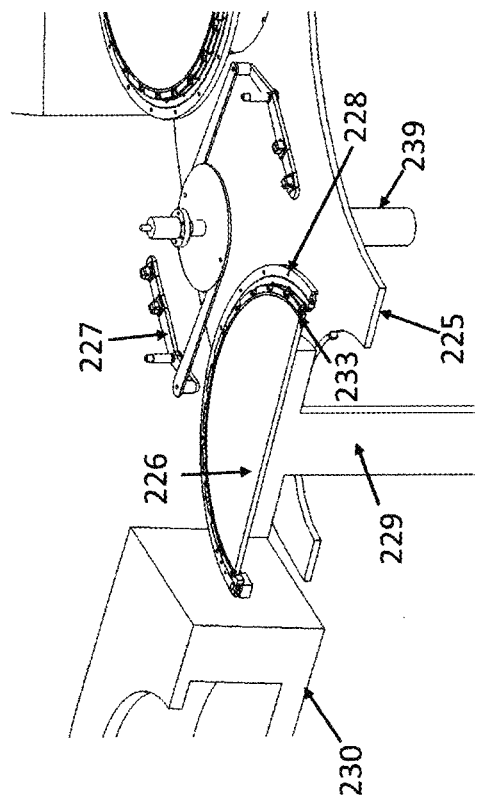
FIG. 4A schematically shows, in enlarged perspective view, a section of the processing module of FIG. 3 in a maintenance configuration with the vacuum chamber omitted for clarity.

FIG. 4A shows process module 230 in a maintenance configuration, in which access to a process module 230 is enabled. As shown, module 230 is pivoted open approximately 180 degrees providing access to base 231 and interior surfaces of the process module 230. The pivot axis is arranged approximately tangentially to the circular edge of vacuum chamber 212. This access allows for preventative maintenance operations such as changing out various shielding elements which may accumulate debris during processing. FIG. 4B shows valve plate 226 held in place against a generally circular inside sealing surface 232 of main vacuum chamber 212, compressing an o-ring 233 located proximate to the sealing surface 232 to provide sealing so that the main chamber 212 can be maintained at high vacuum during the maintenance operation.

Figure 5B:
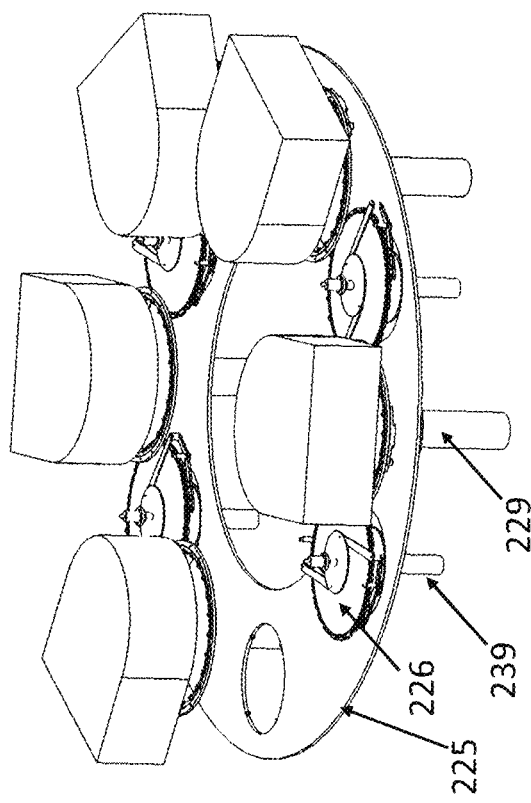
FIG. 5B schematically shows, in perspective view, the batch process chamber of FIGS. 2A and B during operation.
Figure 5A:
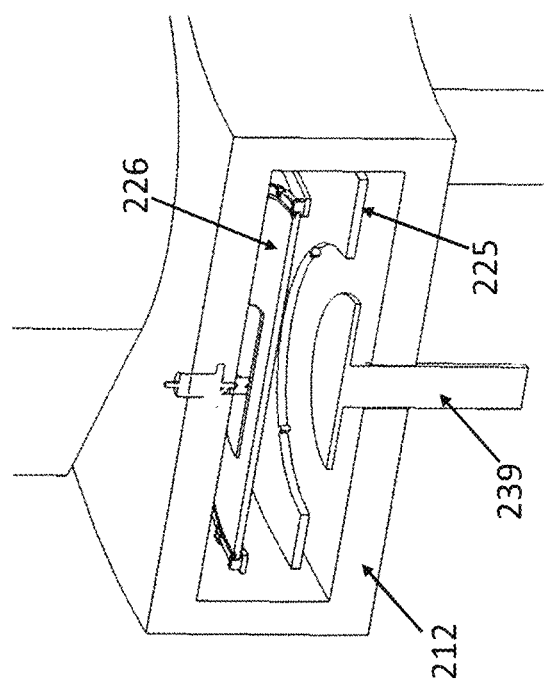
FIG. 5A schematically shows, in enlarged perspective view, a section of a multi-module chamber.

A valve plate example operation will now be described. To activate the valve plate 226, moving from the normal operation shown in FIG. 3 to the maintenance configuration in FIG. 4, several steps can be executed. In FIGS. 5A and 5B, substrates 210 are removed from the multi-module chamber 212 using rotary motion of multi-module carrier 225. Multi-module carrier 225 then rotates until the opening is directly over valve plate lift pedestal 239 and under valve plate 226 in its standby position.

Figure 6B:
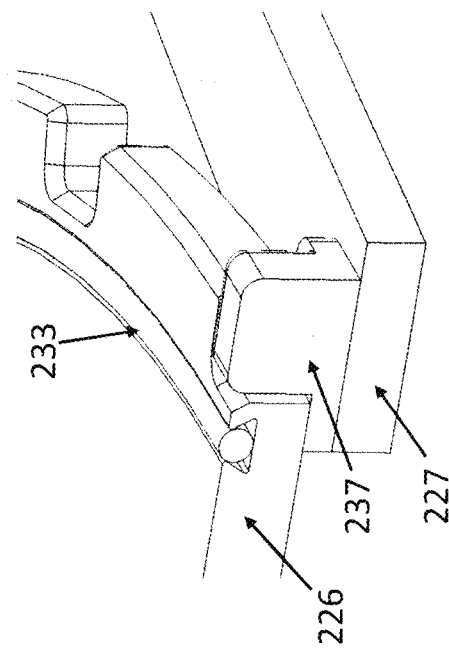
FIG. 6B schematically shows, in enlarged perspective view, an alignment feature within the multi-module chamber.
Figure 6A:
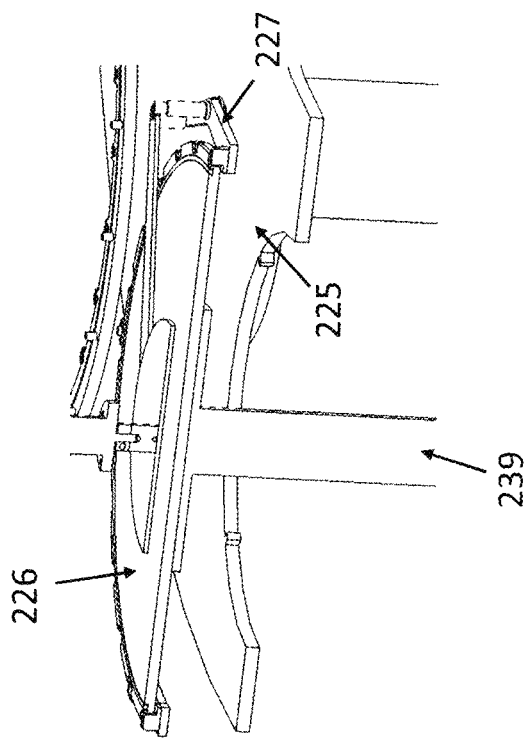
FIG. 6A schematically shows, in enlarged perspective view, a section of a multi-module chamber.

In each of the modules which are to be maintained, valve plate lift pedestal 239 moves upward, lifting valve plate 226 off from support linkage 227 and centering alignment features 237. This is illustrated in FIGS. 6A and 6B.

Figure 7B:
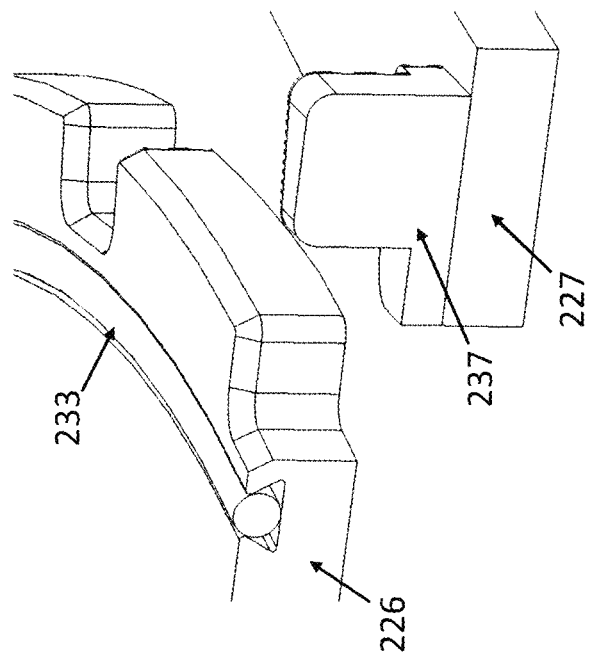
FIG. 7B schematically shows, in enlarged perspective view, an alignment feature within the multi-module chamber.
Figure 7A:
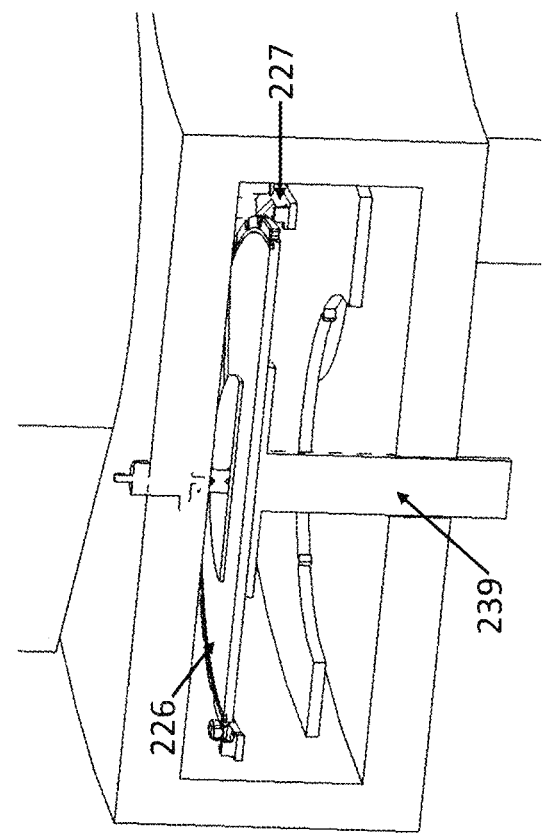
FIG. 7A schematically shows, in enlarged perspective view, a section of a multi-module chamber.

Support linkage 227 is actuated to swing away from valve plate 226. Valve plate 226 is now supported on lift pedestal 239, as shown in FIGS. 7A and 7B.

Figure 8:
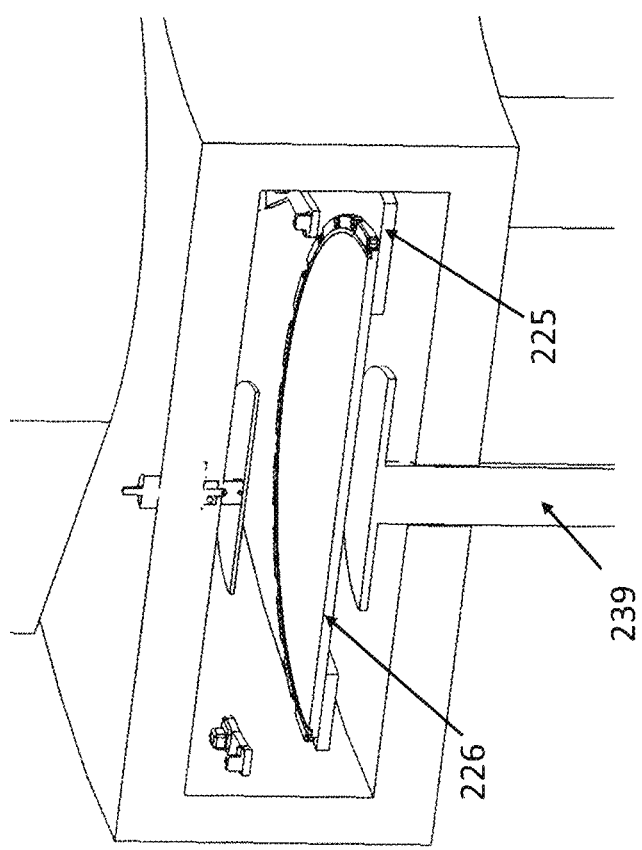
FIG. 8 schematically shows, in enlarged perspective view, a section of a multi-module chamber.

Referring now to FIG. 8, valve plate pedestal 239 moves downward, depositing valve plate 226 onto multi-module carrier 225. Pedestal 239 continues to move downward below carrier 225, so that carrier 225 is free to rotate.

Figure 9B:
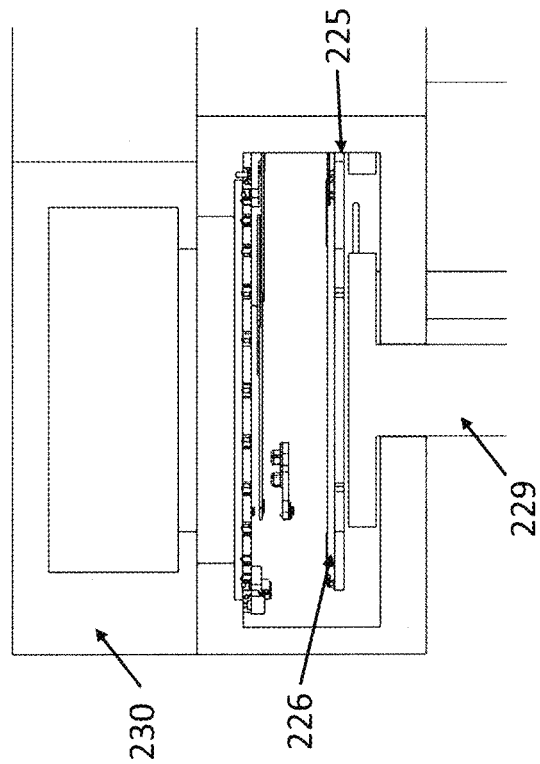
FIG. 9B schematically shows, in sectional view, the processing module of FIG. 9A, FIG. 10A schematically shows, in perspective view, part of a depositing valve plate.
Figure 9A:
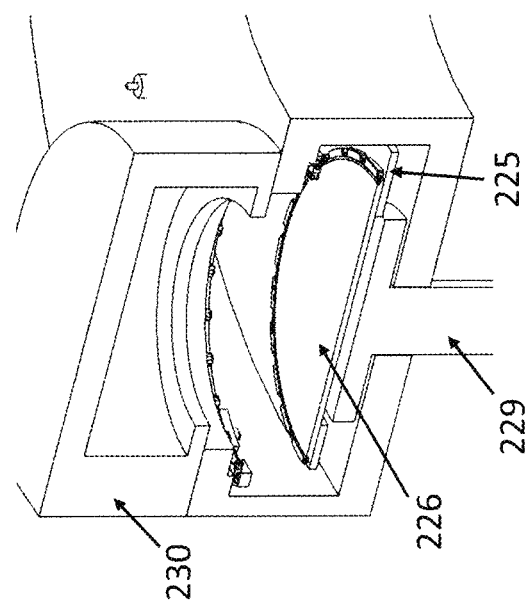
FIG. 9A schematically shows, in enlarged perspective view, a section of the processing module.

As shown in FIGS. 9A and 9B, multi-module carrier disk 225 containing one or more valve plates 226 rotates, positioning each valve plate 226 under its respective process module 230.

Figure 10B:
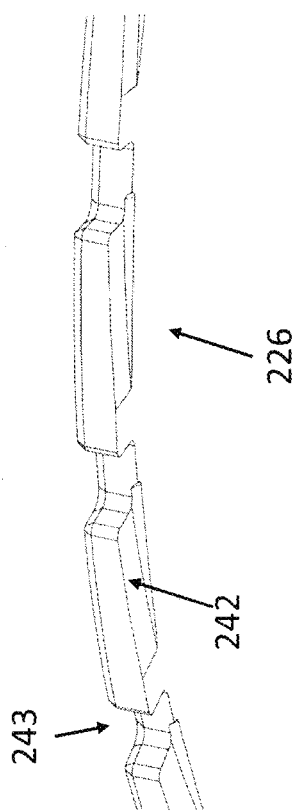
FIG. 10B schematically shows, in enlarged perspective view, the depositing valve plate of FIG. 10A from below.
Figure 10A:
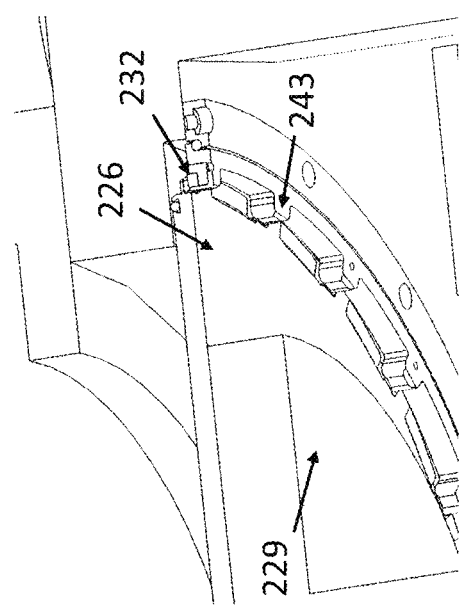

As shown in FIGS. 10A and 10B process chuck 229 moves upward, bringing valve plate 226 in contact with sealing surface 232. The valve plate 226 has peripheral gaps 243 which allow it to move past rollers 244 provided in lock ring 228 (see FIG. 11) acting as a roller bearing. Although shown using a roller bearing, one skilled in the art will understand that other bearings (for example a sliding bearing or ball bearing) could also or alternatively be used to provide low-friction guided motion between the valve plate 226 and locking ring 228. The valve plate 226 also has helical ramped surfaces 242 configured to convert azimuthal motion into leveraged axial force, sufficient to both compress o-ring 232 and resist the atmospheric force which will oppose the axial force when chamber 230 is vented to atmospheric pressure.

Figure 11B:
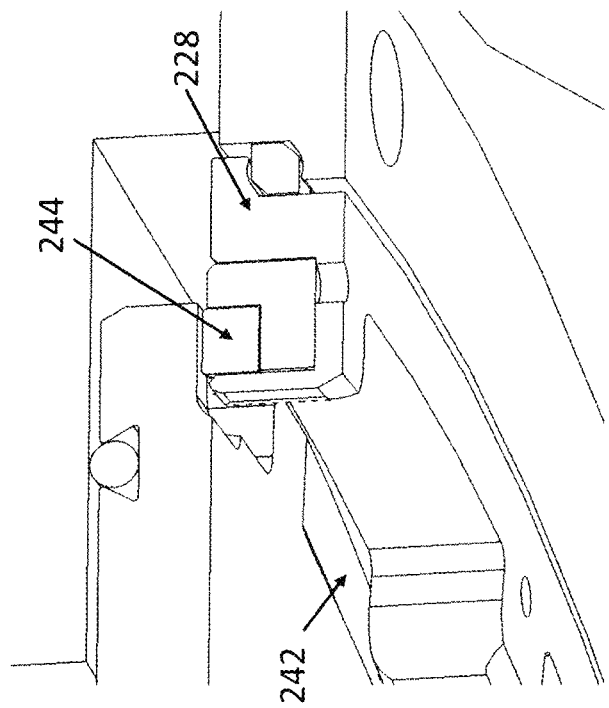
FIG. 11B schematically shows, in perspective view, the locking ring of FIG. 11A.
Figure 11A:
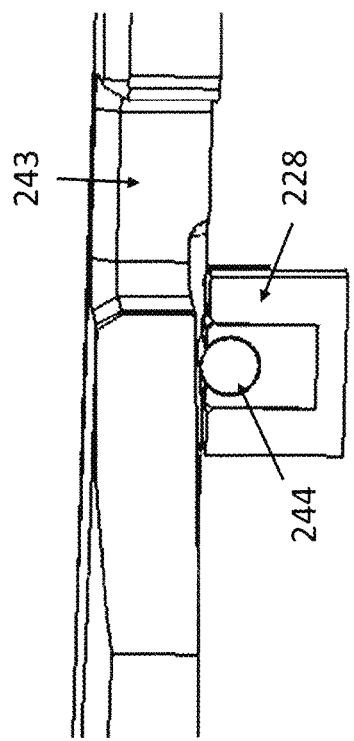
FIG. 11A schematically shows a locking ring.

FIGS. 11A and 11B illustrate locking ring 228 rotated to engage rollers 244 with ramped surface 242.

Figure 12B:
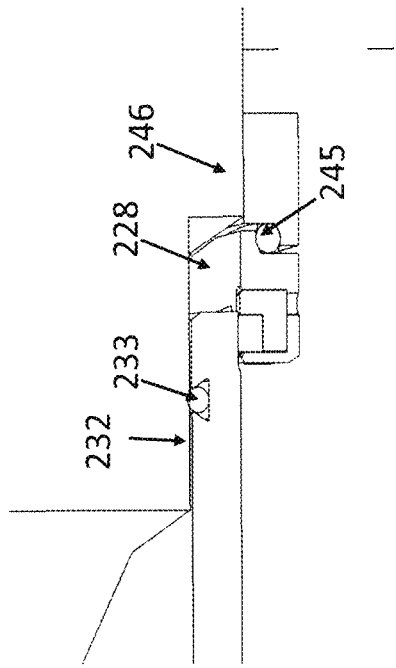
FIG. 12B schematically shows the locking ring of FIG. 12A in sectional view.
Figure 12A:
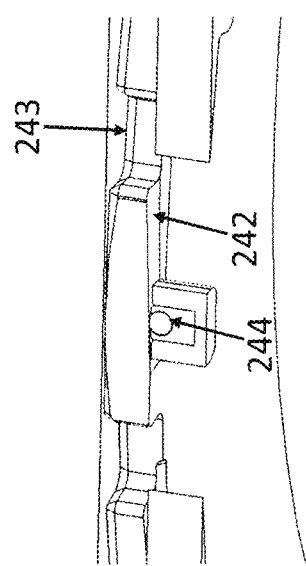
FIG. 12A schematically shows the locking ring of FIG. 11A after rotation.

Locking ring 228 continues to rotate, as the rollers 244 ride along the valve plate ramped surface 242, moving the valve plate 226 vertically to compress the o-ring 233 against sealing surface 232. A ball-bearing race 245 on locking ring support 246 around the periphery of locking ring 228 supports the vertical and radial loads of this motion. An example result is illustrated in FIGS. 12A and 12B.

Figure 13B:
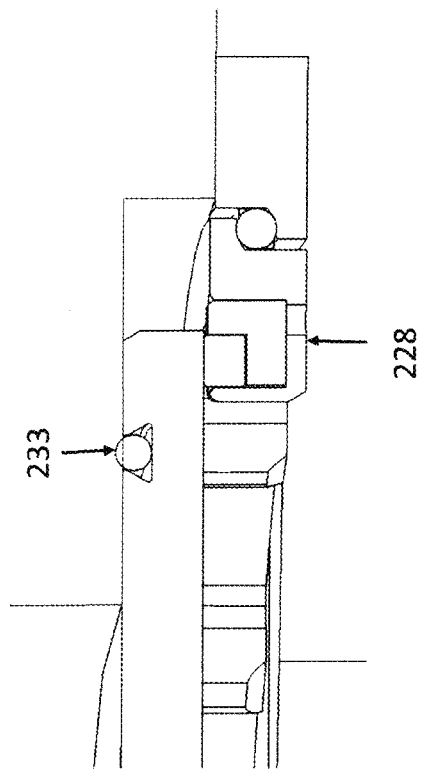
FIG. 13B schematically shows the locking ring of FIG. 13A in sectional view.
Figure 13A:
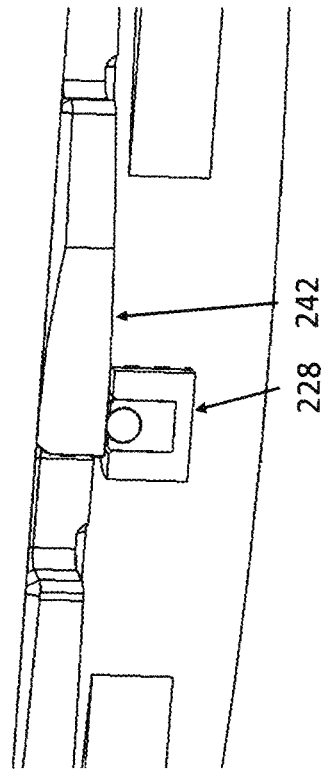
FIG. 13A schematically shows the locking ring of FIG. 12A after further rotation.

Referring now to FIGS. 13A and 13B, locking ring 228 can rotate to a final position, fully compressing o-ring 233 and moving off the valve plate ramped surface 242 so that atmospheric pressure does not cause backward rotation of the locking ring 228.

Figure 14:
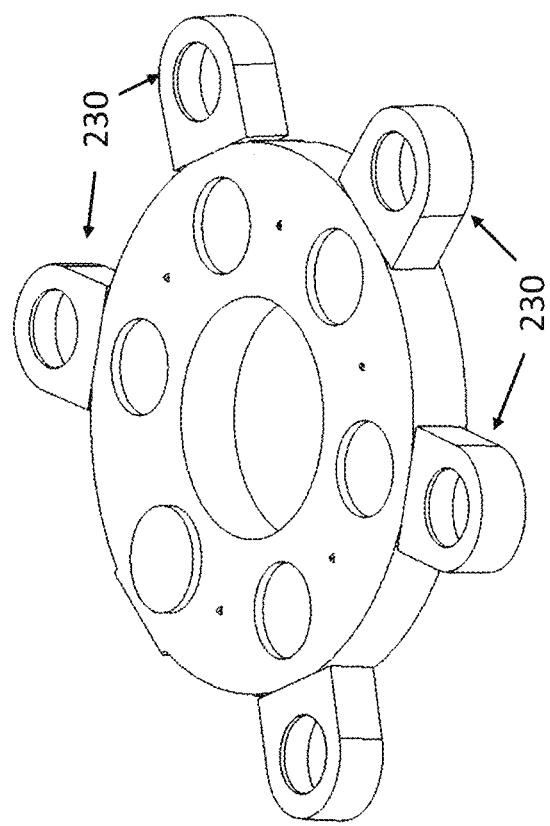
FIG. 14 schematically shows, in perspective view, process modules in an open position.

One or more process modules 230 can be vented to atmosphere and pivoted open to maintenance position. FIG. 14 illustrates all process modules 230 pivoted to an open position.

Accordingly, a single pump apparatus can be used for creating vacuum condition in the vacuum chamber as well as the processing modules, all while enabling independent maintenance access of each processing module. Note that a vacuum or vacuum condition herein is not limited to absolute vacuum, but contemplates pressures less than atmospheric pressure.

One embodiment includes a vapor deposition system having several components. A first vacuum chamber is configured to maintain a gaseous pressure less than atmospheric pressure. The first vacuum chamber is sized to permit transport of two or more semiconductor substrates within the first vacuum chamber. This can include separated transport as substrates are transported to different processing stations. Two or more process modules are configured for processing a semiconductor substrate. Each process module is removably connected to a respective port (opening) of the first vacuum chamber such that each process module is in vacuum communication with the first vacuum chamber when connected to the respective port. Each process module is configured to maintain a gaseous pressure less than atmospheric when connected to the respective port. In other words, the process modules can be connected to the first vacuum chamber forming a vacuum seal so that a vacuum can be maintained through the vacuum chamber and connected process modules.

The first vacuum chamber contains a port sealing mechanism configured to create a vacuum seal at each port such that when a first port is sealed and a first process module corresponding to the first port is disconnected from the first port, a vacuum condition is maintained within the first vacuum chamber while the first process module is open to atmospheric pressure. In other words, openings in the vacuum chamber where process modules connect can be closed or sealed to detach individual process modules while still maintaining vacuum within the first vacuum chamber and other connected process modules. Accordingly, substrates positioned either within the first vacuum chamber or other connected process modules remain in vacuum condition.

In other embodiments, the system includes at least two sputter etch cleaning process modules and at least two vapor deposition process modules. Accordingly, if a given process module needs to be accessed for maintenance, processing of wafer can continue with remaining, connected process modules. Processing modules can be pivotally connected to the first vacuum chamber or vapor deposition system and can be pivoted or rotated away from the vacuum chamber for accessing shields to replace or surfaces to clean. During this cleaning, wafer processing can continue with remaining processing modules that are still attached to the first vacuum chamber. Moreover each attached process module can be processing a wafer while an unattached process module is being serviced. Thus, wafer processing operations can continue while one or more process modules are receiving maintenance. This reduces any impact to throughput, all while providing a system with fewer vacuum pumps or a single vacuum pump.

As described above, a substrate carrier can be used to transport semiconductor substrate within the first vacuum chamber. This vacuum chamber can be ring-shaped with a circular pathway as described, or can be linear, rectangular, et cetera.

Valve plates can be used for sealing ports (openings) on the first vacuum chamber. Other seals can be implemented. A locking ring can be implemented with the valve plate to securely attach the valve plate to a port to maintain vacuum conditions within the first vacuum chamber.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A vapor deposition system comprising:
a vacuum chamber configured to maintain a gaseous pressure less than atmospheric pressure, the vacuum chamber sized to permit transport of two or more semiconductor substrates within the vacuum chamber;
two or more process modules each configured for processing a semiconductor substrate, each process module being removably connected to a respective port of the vacuum chamber such that each process module is in vacuum communication with the vacuum chamber when connected to the respective port, each process module being configured to maintain the gaseous pressure less than atmospheric when connected to the respective port; and
a port sealing mechanism configured to create a vacuum seal at each port such that when a first port is sealed and a first process module corresponding to the first port is disconnected from the first port, a vacuum condition is maintained within the vacuum chamber while the first process module is open to atmospheric pressure,
wherein the port sealing mechanism includes a valve plate that covers the respective port to create the vacuum seal, and the vapor deposition system further comprising a lifting mechanism configured to selectively lift the valve plate to the first port and lift the semiconductor substrate into the first process module.

2. The vapor deposition system of claim 1, wherein when the first port is sealed and the first process module is disconnected, semiconductor substrates located within the vacuum chamber remain within the vacuum condition.

3. The vapor deposition system of claim 1, wherein when the first port is sealed and the first process module is disconnected, a given semiconductor substrate located within a second process module connected to a second port remains at the vacuum condition.

4. The vapor deposition system of claim 1, wherein at least one process module of the two or more process modules is configured to sputter etch the semiconductor substrate when positioned therein, and wherein at least one process module of the two or more process modules is configured to vapor deposit a film on the semiconductor substrate when positioned therein.

5. The vapor deposition system of claim 1, wherein each process module is pivotally attached to the vacuum chamber and is removable from the respective port by pivoting each process module away from the respective port of the vacuum chamber.

6. The vapor deposition system of claim 1, wherein the vapor deposition system is configured to simultaneous process multiple semiconductor wafers using the two or more process modules.

7. The vapor deposition system of claim 1, further comprising a substrate carrier that transports semiconductor substrates within the vacuum chamber.

8. The vapor deposition system of claim 7, wherein the substrate carrier has a circular pathway configured to transport the semiconductor substrates among the two or more process modules by rotation.

9. The vapor deposition system of claim 1, further comprising a locking ring positioned at the respective port and configured to hold the valve plate sealed to the respective port.

10. The vapor deposition system of claim 1, wherein the two or more process modules includes at least four process modules, wherein at least two process modules of the at least four process modules are configured to sputter etch the semiconductor substrate when positioned therein, and wherein at least two process modules of the at least four process modules are configured to vapor deposit a film on the semiconductor substrate when positioned therein.

11. The vapor deposition system of claim 1, wherein a single vacuum pump creates the vacuum condition for the vacuum chamber as well as the two or more process modules.

12. A vapor deposition system comprising:
a vacuum chamber;
two or more process modules in vacuum communication with the vacuum chamber;
a valve plate disposed within the vacuum chamber;
a rotatable valve carrier configured to rotate and so transport the valve plate to position the valve plate under a sealing surface of at least one process module; and
a locking ring configured to secure the positioned valve plate against the sealing surface of said at least one process module with sufficient force to maintain vacuum pressure in the vacuum chamber while the at least one process module is removed from vacuum communication with the vacuum chamber to atmospheric pressure.

\* \* \* \* \*